(12) United States Patent
Hiyama

(10) Patent No.: US 7,602,595 B2
(45) Date of Patent: Oct. 13, 2009

(54) SEMICONDUCTOR DEVICE

(75) Inventor: Kazuaki Hiyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 152 days.

(21) Appl. No.: 11/780,052

(22) Filed: Jul. 19, 2007

(65) Prior Publication Data

US 2008/0198526 A1 Aug. 21, 2008

(30) Foreign Application Priority Data

Feb. 21, 2007 (JP) ............................. 2007-041212

(51) Int. Cl.
*H02H 7/00* (2006.01)
(52) U.S. Cl. ...................................................... 361/93.7
(58) Field of Classification Search .................. 361/93.7
See application file for complete search history.

(56) References Cited

U.S. PATENT DOCUMENTS

| 2002/0141126 A1 | 10/2002 | Tabata |
| 2002/0176215 A1* | 11/2002 | Hiyama et al. ............. 361/93.1 |
| 2005/0099751 A1* | 5/2005 | Kumagai ..................... 361/100 |
| 2006/0006166 A1* | 1/2006 | Chen et al. .................. 219/494 |

FOREIGN PATENT DOCUMENTS

| JP | 2001-168652 | 6/2001 |
| JP | 2002-26707 | 1/2002 |
| JP | 2002-300017 | 10/2002 |
| JP | 2005-151631 | 6/2005 |
| JP | 2005328606 A * | 11/2005 |

* cited by examiner

*Primary Examiner*—Stephen W Jackson
*Assistant Examiner*—Angela Brooks
(74) *Attorney, Agent, or Firm*—Leydig, Voit & Mayer, Ltd.

(57) ABSTRACT

A semiconductor device includes a switching element outputting from a sense terminal a sense current at a fixed rate relative to a main current flowing in the switching element; a sense resistor connected at a first end to the sense terminal and to ground at a second end; a correction current generating circuit that supplies and extracts a correction current to at the first end of the sense resistor; an overcurrent protective circuit that receives a sense voltage generated when the sense current and the correction current flow through the sense resistor, and outputs a stop signal when the sense voltage is larger than a reference voltage; and a driving circuit that stops driving the switching element when the stop signal is received from the overcurrent protective circuit.

4 Claims, 14 Drawing Sheets

SEMICONDUCTOR DEVICE

BACKGROUND OF THE INVENTION

1. Field of the Invention

The present invention relates to a semiconductor device having an overcurrent protective circuit that detects the flow of excessive main current (overcurrent) exceeding a predetermined limit in a switching element, and more specifically to a semiconductor device that can regulate the operation level of a overcurrent protective circuit without changing the reference voltage.

2. Background Art

A semiconductor device that drives a switching element, such as an insulated gate bipolar transistor (IGBT) element, and also has an overcurrent protective circuit that detects the flow of excessive main current (overcurrent) exceeding a predetermined limit in a switching element, has been used in power converters, such as a DC/DC converters and inverter devices.

A semiconductor device wherein switching elements, switching device driving functions, overcurrent protective functions and the like are integrated is called an IPM (intelligent power module). All the semiconductor devices having IPM functions, DC link capacitors, on/off signal generating functions of the switching elements (inverter control), means to detect the state of load (various sensors) and the like are called inverter devices.

In IPMs or the like, the overcurrent protective function is realized by special ASIC or hardware (H/W) such as electronic circuits. Although the overcurrent protective function by H/W has an advantage of high response speed to unusual generation of overcurrent or the like, it has a disadvantage of low current detection accuracy. Therefore, there is a problem of large variation of overcurrent levels at which the overcurrent protective circuit operates.

A general inverter device has relatively accurate current detecting means, such as a current transformer and a hole element, to detect output current. The output current of the current detecting means is inputted into a microcomputer of the inverter controlling section or the like via an AD converter. When the program (software) implemented on the microcomputer (MPU) detects an overcurrent, the program takes protective action, such as stopping the operating of the inverter. Although the protective function by software (S/W) has an advantage of higher current detection accuracy than the protective function by H/W of IPMs, it has a disadvantage of low response speed. Therefore, there is a problem of delay in protection leading to the failure of the switching element or the damage of the load.

Here, the reason why the current detection accuracy of overcurrent protective functions by IPMs or the like is low will be described. In IPMs or the like, to realize overcurrent protective functions, a switching element, such as IGBT and MOSFET, is provided with a current sensing element, to use for current detection. The current sensing element has a cell structure identical to the cell structure of the switching element, connected to the switching element in parallel, and has a constant cell area to the switching element.

FIG. 12 is a diagram illustrating an equivalent circuit of a switching element that incorporates a current sensing element Under ideal operation conditions, Area ratio (Cell area of current sensing element/Cell area of switching element) agrees with Shunt ratio (Sense current/Switching element current) of the switching element and the current sensing element to become Sense current (Switching element current×Cell area of current sensing element/Cell area of switching element).

The overcurrent protective circuit performs protective operations, such as turning off the switching element, when the sense current value flowing through the current sensing element exceeds a predetermined limit. Actually, the sense voltage wherein the sense current value is converted to a voltage and the reference voltage are inputted in a comparator, and the output of the comparator is made to be the operation initiating trigger. Conventional semiconductor devices wherein the sense current value is thus converted into a voltage are shown in FIGS. 13 and 14.

The semiconductor device shown in FIG. 13 has a current-voltage converting circuit using an operational amplifier. In this case, since the portion of the operational amplifier between the −terminal and the +terminal is in an imaginary short-circuit state, the operation of the current sensing element is not affected. However, in a general power converter, since the changing rate per hour of the switching element current is as large as several kA/μs and the changing rate of the sensing element current is also large, delay in response of the operational amplifier cannot be ignored, and accurate current-voltage conversion cannot be achieved. Furthermore, since the obtained sense voltage is a negative value, two power sources of positive and negative including the overcurrent protective circuit were required, and the size reduction of the device became difficult. Therefore, the circuit shown in FIG. 13 is little used.

The circuit shown in FIG. 14 employs a simple method wherein the voltage drop of the sense resistor is treated as the sense voltage, and does not require an operational amplifier having a high-speed response as the circuit shown in FIG. 13. Therefore, the circuit shown in FIG. 14 has been heretofore used. However, since the circuit shown in FIG. 14 has the problems described below, current detecting accuracy is low, and current levels of the switching element at which the overcurrent protective circuit operates is substantially varied.

Firstly, since the gate-emitter voltage of a current sensing element equals to (gate-emitter voltage of a switching element)−(sense voltage), the gate-emitter voltage $V_{GE}$ of the switching element does not equal to the $V_{GE}$ of the current sensing element. Similarly, the collector-emitter voltage $V_{CE}$ of the switching element does not equal to the $V_{CE}$ of the current sensing element. Therefore, the relationship of (Cell area of current sensing element/Cell area of switching element=Sense current/Switching element current) is not established. Further, since the gate threshold value of IGBT or MOSFET has temperature characteristics, the effect of the difference between $V_{GE}$ and $V_{CE}$ of the switching element and the current sensing element on (Shunt ratio=Sense current/Switching element current) varies depending on element temperatures. This means that the shunt ratio is varied by element temperatures. Therefore, conventional semiconductor devices had a problem wherein when the element temperature of the switching element was varied, the operation level of the overcurrent protective circuit was also varied.

A semiconductor device solving this problem has been proposed (for example, refer to Japanese Patent Laid-Open No. 2005-151631; FIG. 2). In the circuit described in Japanese Patent Laid-Open No. 2005-151631; FIG. 2, a sense voltage (output S4 of a maximum value retaining circuit 232) and a reference voltage (output REF of a reference voltage generating circuit 233) are inputted in a comparing circuit 234. When overcurrent flows in a switching element 1, the output S2 of the comparing circuit 234 performs protecting operations, such as the activation of the drive circuit 211 to turn the switching element 1 off. In this circuit, by making the reference voltage REF variable according to the temperature of the switching element 1, it is possible to maintain the operation level of the overcurrent protective circuit constant even if the element temperature of the switching element 1 varies.

In the circuit described in Japanese Patent Laid-Open No. 2005-151631; FIG. 2, in order to minimize the effect of the sense voltage in the shunt ratio of the switching element current and the sensing element current, it is required to reduce the value of the sense resistor as much as possible to reduce the sense voltage and the reference voltage. However, since the comparing circuit is operated by one-side power source, if the reference voltage is lowered to excessively close to the GND level, the circuit cannot operate. Therefore, since the width of the variable range of the reference voltage corresponding to temperature change could not be widened, the operation level of the overcurrent protective circuit could not be adjusted within a sufficiently wide range. Furthermore, if the reference voltage of the overcurrent protective circuit was lowered to lower the trip level, the malfunction by noise overlapped with the sense voltage caused a problem.

In addition, a reference voltage generating element, such as a zener diode and a band gap reference having favorable temperature characteristics, is generally used in a reference voltage generating circuit. Although it is difficult to make the voltages of these reference voltage generating elements variable, the specific method to vary the reference voltage is not disclosed in Japanese Patent Laid-Open No. 2005-151631; FIG. 2.

SUMMARY OF THE INVENTION

The present invention has been made to solve the above-described problems. It is an object of the present invention to provide a semiconductor device that can adjust the operation level of the overcurrent protective circuit without changing the reference voltage.

A semiconductor device according to the present invention has a switching element having a cell isolating structure that can output a sense current given in a predetermined shunt rate to a main current from a sense terminal; a sense resistor one of whose ends is connected to the sense terminal and the other end is grounded; a correction current generating circuit that supplies a correction current in both directions of discharge and suction to an end of the sense resistor; an overcurrent protective circuit that inputs a sense voltage generated when the sense current and the correction current flow via the sense resistor, and outputs a stop signal when the sense voltage is larger than a predetermined reference voltage; and driving circuit that stops driving the gate of the switching element when the stop signal is received from the overcurrent protective circuit.

According to the present invention, the operation level of the overcurrent protective circuit can be adjusted without changing the reference voltage.

DETAILED DESCRIPTION OF THE PREFERRED EMBODIMENTS

First Embodiment

Figure 1:
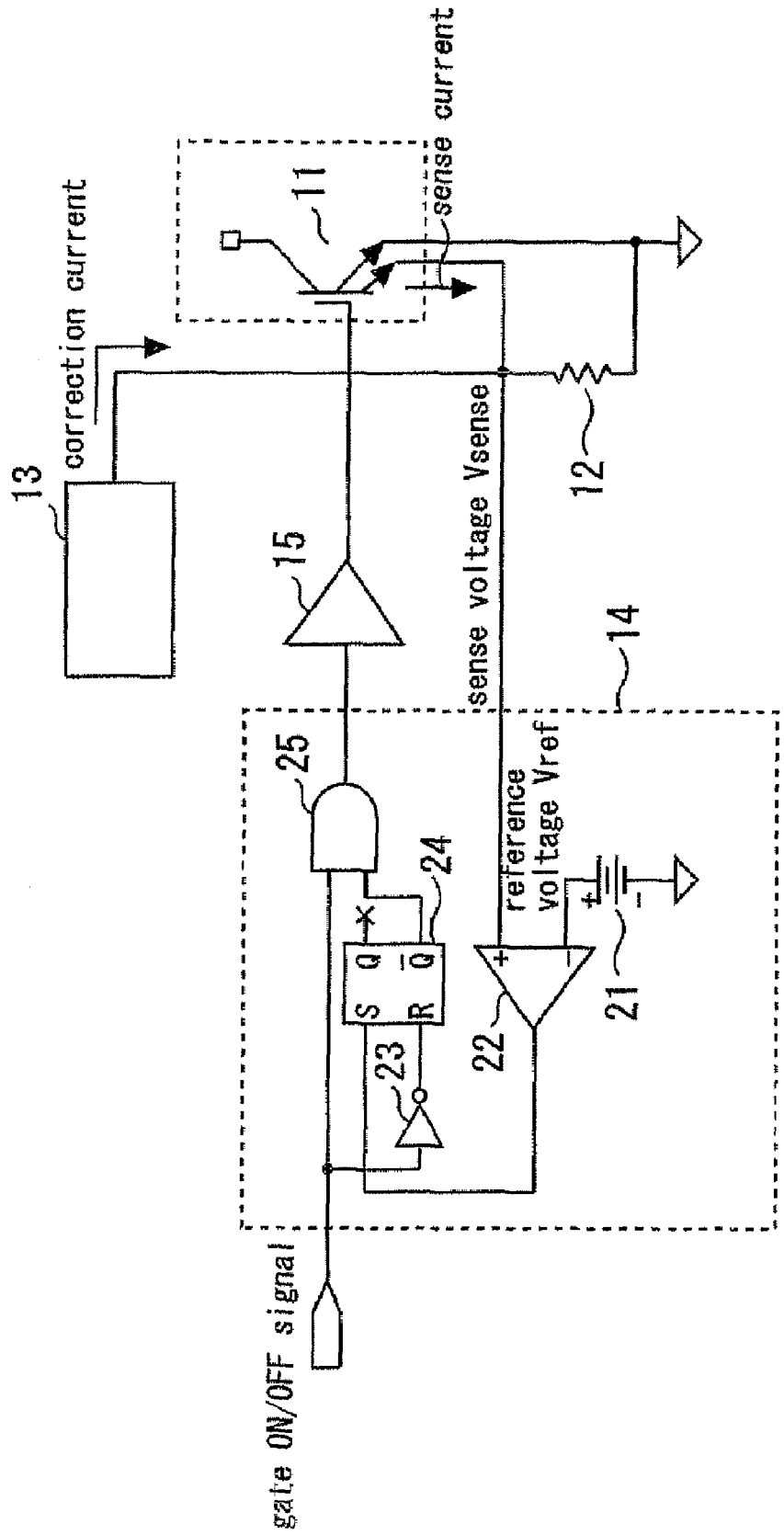
FIG. 1 is a circuit diagram illustrating a semiconductor device according to the first embodiment of the present invention.

FIG. 1 is a circuit diagram illustrating a semiconductor device according to the first embodiment of the present invention. The semiconductor device has an IGBT 11 (switching element), a sense resistor 12, a correction current generating circuit 13, an overcurrent protective circuit 14, and a driving circuit 15.

The IGBT 11 has a cell isolating structure that can output the sense current given at a predetermined shunt rate relative to the collector current (main current) from the sense terminal thereof. Specifically, when the collector current flows in the IGBT 11, a part of the collector current is outputted as the sense current from the sense terminal.

An end of the sense resistor 12 is connected to the sense terminal of the IGBT 11, and the other end thereof is grounded. The correction current generating circuit 13 supplies correction current in both directions of discharge and charge to an end of the sense resistor 12. When the sense and correction currents flow through the sense resistor 12, a voltage drop (sense voltage $V_{sense}$) occurs.

The overcurrent protective circuit 14 has a reference voltage generating circuit 21, a comparator 22, an inverter 23, a flip-flop circuit 24, and an AND circuit 25. The reference voltage generating circuit 21 generates a predetermined reference voltage $V_{ref}$, for example, 0.5 V. The comparator 22 outputs the result of comparing the sense voltage $V_{sense}$ with the reference voltage $V_{ref}$. The inverter 23 reverses the gate ON/OFF signal. The flip-flop circuit 24 receives the output signal of the comparator 22 at the S terminal, and receives the output signal of the inverter 23 at the R terminal. The AND circuit 25 receives the gate ON/OFF signal from outside the overcurrent protective circuit 14 and the output signal from the output terminal $\overline{Q}$ of the flip-flop circuit 24, and performs an AND operation.

Figure 2:
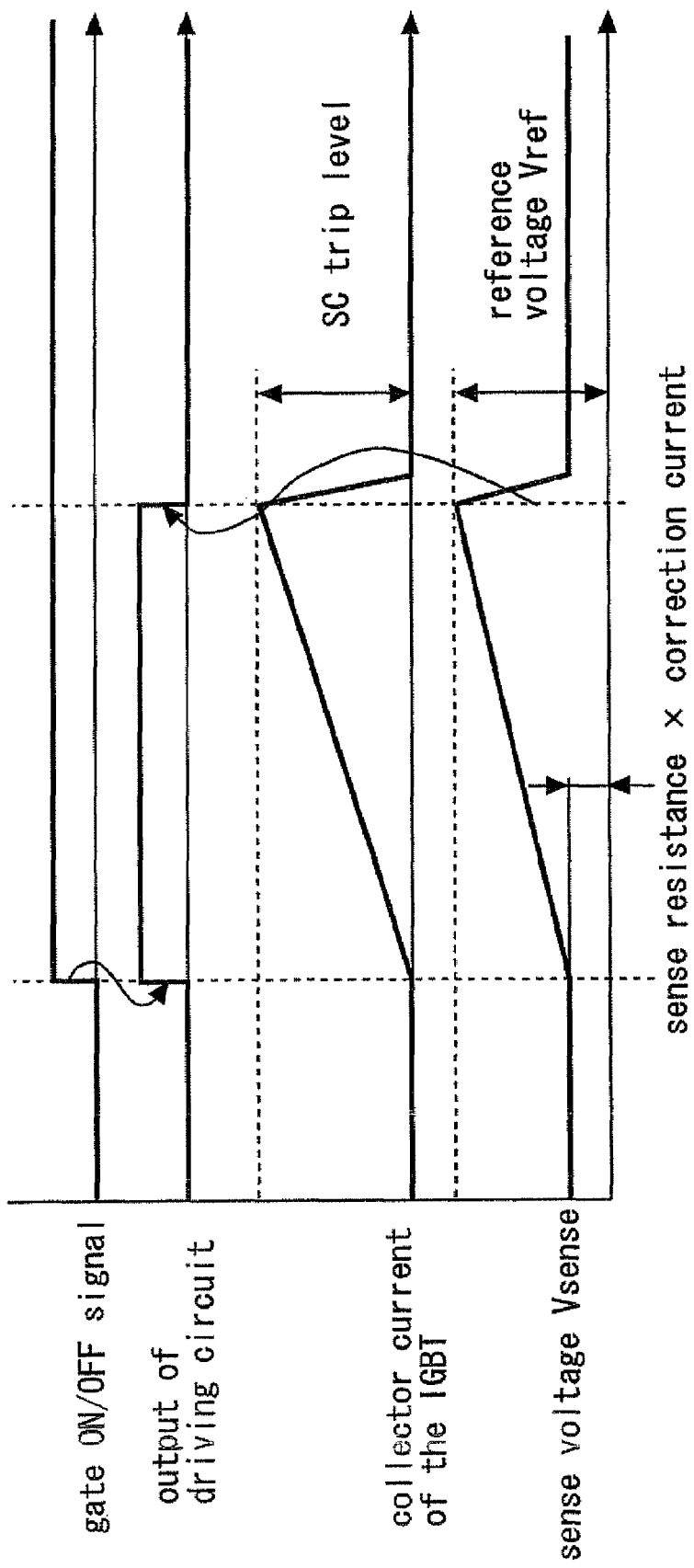
FIG. 2 is a timing chart illustrating the operation of the circuit shown in FIG. 1.

The operation of the semiconductor device having the above-described configuration will be described. FIG. 2 is a timing chart illustrating the operation of the circuit shown in FIG. 1. In normal operation, since the sense voltage $V_{sense}$ is lower than the reference voltage $V_{ref}$, the output of the comparator 22 is "Low". Therefore, when the gate ON/OFF signal is "High", the overcurrent protective circuit 14 outputs a "High" signal (driving signal). The driving circuit 15 receives the driving signal from the overcurrent protective circuit 14, and drives the IGBT 11.

On the other hand, when the collector current of the IGBT 11 is a predetermined value (SC trip level) or larger, the sense voltage $V_{sense}$ exceeds the reference voltage $V_{ref}$, and the output of the comparator 22 inverts from "Low" to "High". Following this, the output of the flip-flop circuit 24 is also inverted, and the overcurrent protective circuit 14 outputs a "Low" signal (stop signal). Specifically, the overcurrent protective circuit 14 receives the sense voltage $V_{sense}$ and outputs the stop signal when the sense voltage $V_{sense}$ is higher than a predetermined reference voltage $V_{ref}$. The driving circuit 15 stops the driving of the IGBT 11 when the driving circuit 15 receives the stop signal from the overcurrent protective circuit 14.

Here, when correction current is supplied to the sense resistor 12, the sense voltage is elevated to the sense resistance×(sense current+correction current). Consequently, the overcurrent protective circuit is operated by a smaller collector current than the current without the correction current. On the other hand, when the direction of the correction current is reversed, the operative level of the overcurrent protective circuit can be raised.

Figure 3:
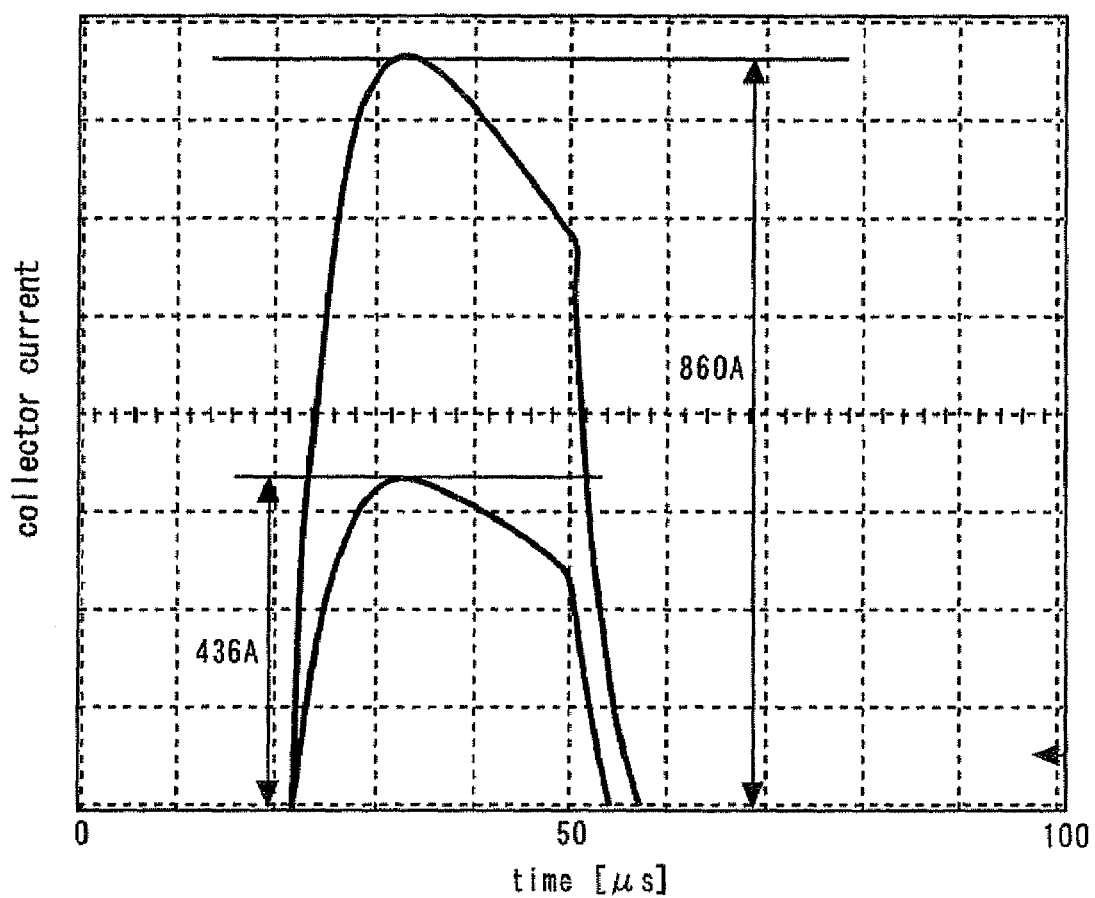
FIG. 3 is a graph showing the results of measuring the collector current flowing through the IGBT shown in FIG. 1 in the case with and without correction current.

FIG. 3 is a graph showing the results of measuring the collector current flowing through the IGBT shown in FIG. 1 in the case with and without correction current. When there is no correction current, the collector current at which the protective circuit operates is 860 A; however, when there is the correction current, it lowers to 436 A. Thereby, it was confirmed that the operative level of the overcurrent protective circuit could be adjusted by the correction current.

As described above, according to the first embodiment, the sense voltage can be adjusted, at will, independently from the sense current by supplying the correction current, from the correction current generating circuit. As a result, the operative level of the overcurrent protective circuit can be adjusted without changing the reference voltage. Therefore, no erroneous operations due to excessive lowering of the reference voltage, no malfunctions due to noise or the like occur, as in conventional devices. Furthermore, since it is not required to change the configuration of the overcurrent protective circuit, application of the embodiment to semiconductor devices with ASICs of conventional configurations is easy.

Although a basic configuration for protective circuit operation as the overcurrent protective circuit 14 was described, the configuration or operation of the overcurrent protective circuit 14 may be different in practical devices.

Second Embodiment

Figure 4:
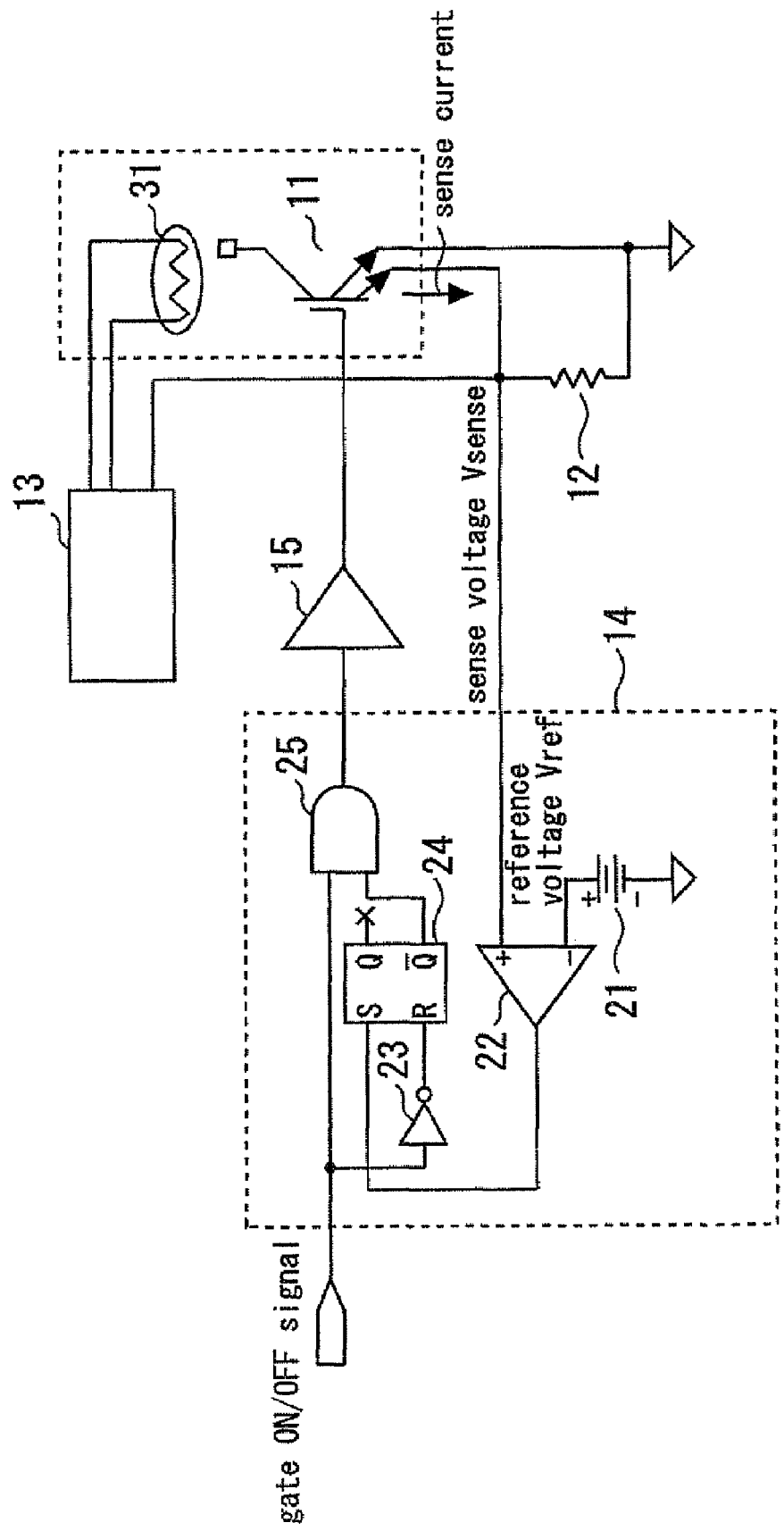
FIG. 4 is a circuit diagram illustrating a semiconductor device according to the second embodiment of the present invention.

FIG. 4 is a circuit diagram illustrating a semiconductor device according to the second embodiment of the present invention. A temperature sensor 31 for measuring the element temperature of the IGBT 11 is installed in the vicinity of the IGBT 11, or incorporated in the IGBT 11. The correction current generating circuit 13 is a temperature-current conversion circuit, and increases or decreases the correction current so that it is proportional to the element temperature. Other configurations are identical to the configurations of the first embodiment.

Figure 5:
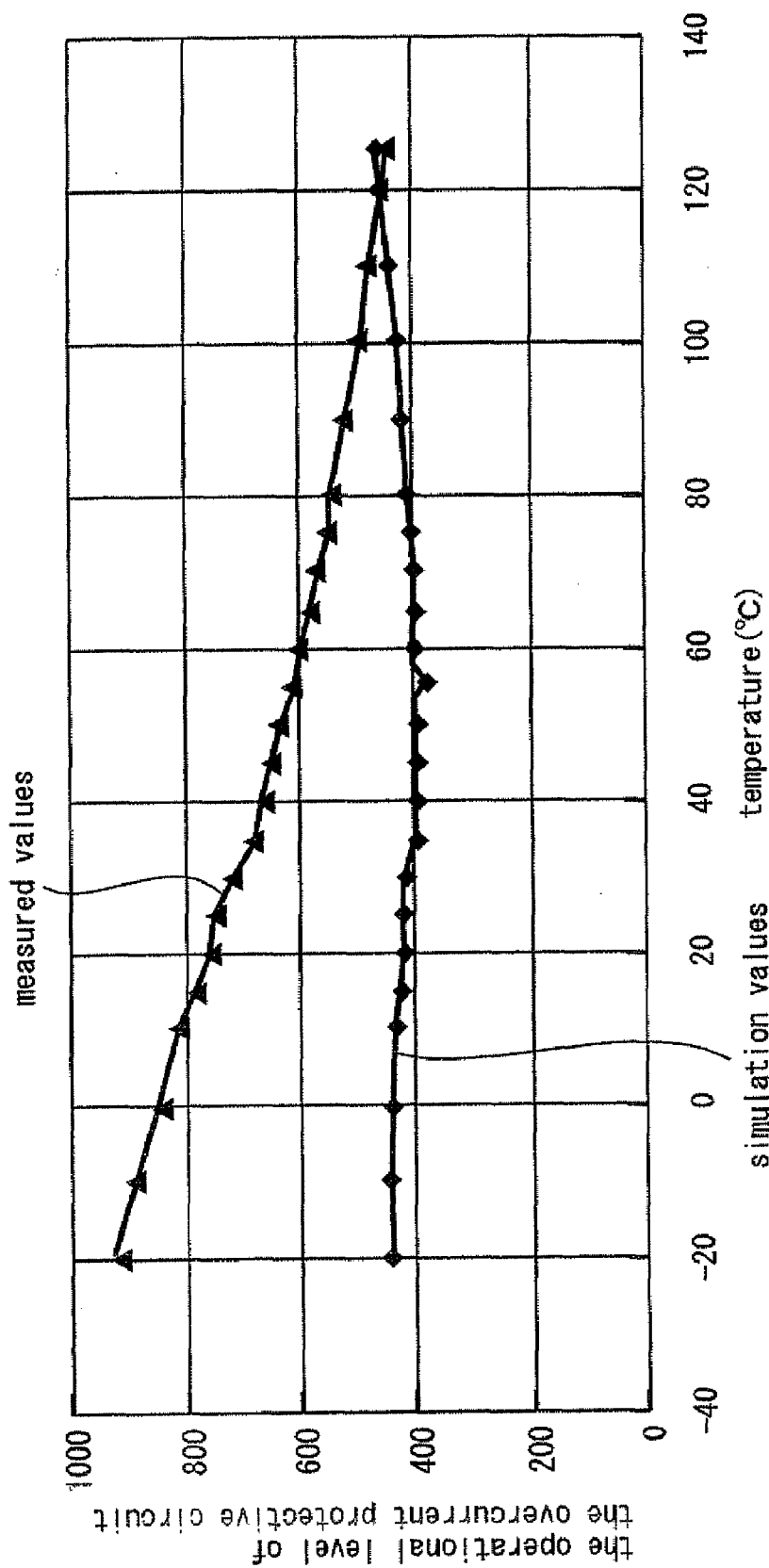
FIG. 5 is a graph showing the temperature characteristics of the operational level of an overcurrent protective circuit.

FIG. 5 is a graph showing the temperature characteristics of the operational level of an overcurrent protective circuit. In FIG. 5, measured values mean the operational levels of the overcurrent protective circuit measured without flowing correction current. On the other hand, simulation values mean the operational levels of the overcurrent protective circuit simulated when correction current of $-A\times$(temperature−120)+B was flowed in the sense resistor 12. In the above formula, A and B are predetermined constants. It is known from these results that the temperature characteristics can be cancelled by flowing correction current proportional to the element temperature of the IGBT 11 in the sense resistor 12. Therefore, according to the second embodiment, even if the element temperature of the switching element varies, the operational level of the overcurrent protective circuit can be maintained constant.

Figure 6:
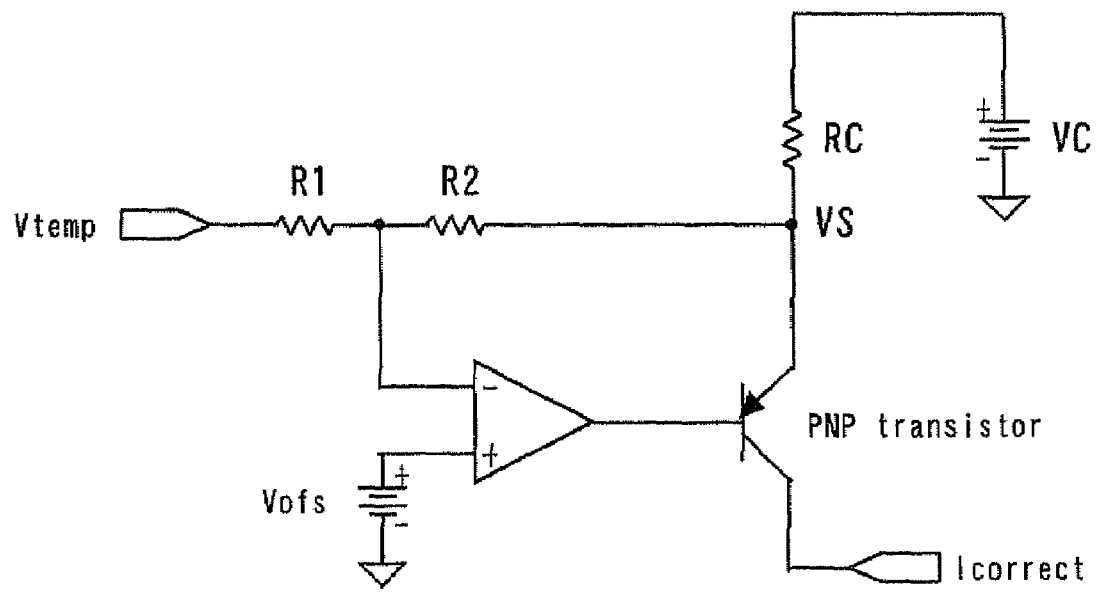
FIG. 6 is a circuit diagram illustrating a correction current generating circuit according to the second embodiment of the present invention.

FIG. 6 is a circuit diagram illustrating a correction current generating circuit according to the second embodiment of the present invention. The correction current generating circuit is a temperature-current conversion circuit composed of a constant-current circuit using an operational amplifier. The temperature characteristics of the SC trip level when the temperature is not corrected are supposed to have a negative gradient that lowers at high temperatures. $V_{temp}$ is the output voltage of the temperature sensor, and is supposed to have characteristics of $V_{temp}=-A\times T_j+B$ against the element temperature $T_j$ of the switching element. In this case, the correction current $I_{correct}$ takes the following value:

$$VS = -\frac{R2}{R1}Vtemp + \frac{R1+R2}{R1}Vofs$$

$$Icorrect = \frac{VC-VS}{Rc}$$

$$= \frac{1}{Rc}\left[VC - \frac{R1+R2}{R1}Vofs + \frac{R2}{R1}Vtemp\right]$$

$$= \frac{1}{Rc}\left[VC - \frac{R1+R2}{R1}Vofs + \frac{R2}{R1}(-A\times Tj + B)\right]$$

Third Embodiment

Figure 7:
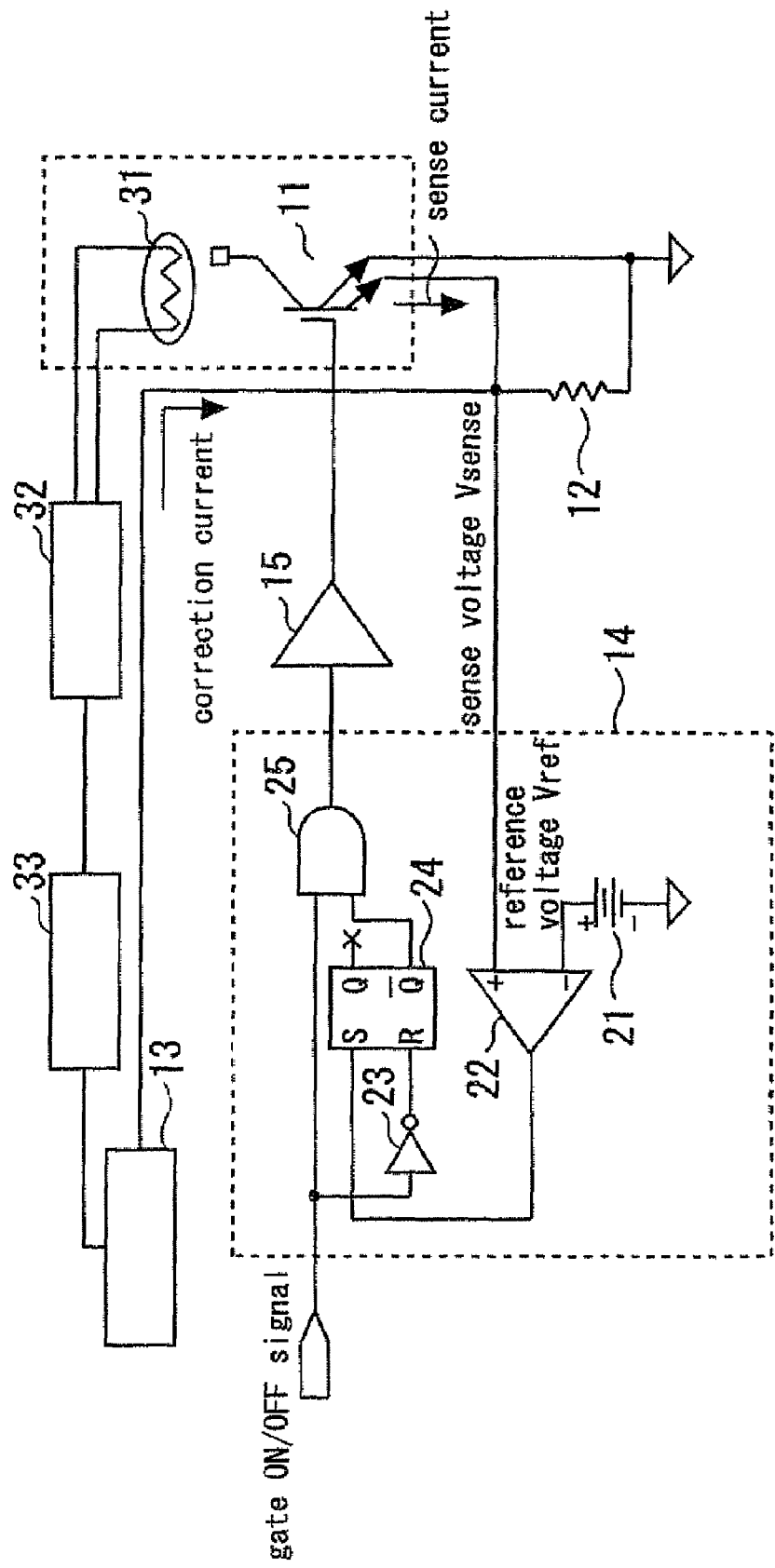
FIG. 7 is a circuit diagram illustrating a semiconductor device according to the third embodiment of the present invention.

FIG. 7 is a circuit diagram illustrating a semiconductor device according to the third embodiment of the present invention. A temperature sensor 31 that measures the element temperature of the IGBT 11 is installed in the vicinity of the IGBT 11 or built in the IGBT 11. The semiconductor device is provided with an A/D conversion circuit 32 and a microprocessor 33. The microprocessor 33 inputs the signal from the temperature sensor 31 via the A/D conversion circuit 32, controls the correction current generating circuit 13 according to calculation formula, maps or the like incorporated in a program, and increases or decreases the correction current corresponding to the element temperature of the IGBT 11. Other configurations are identical to the configurations of the first embodiment.

According to the third embodiment, even if the operational level of the overcurrent protective circuit does not have monotonically decreasing temperature characteristics as the measured values shown in FIG. 5, the operational level of the overcurrent protective circuit can be maintained constant.

Figure 8:
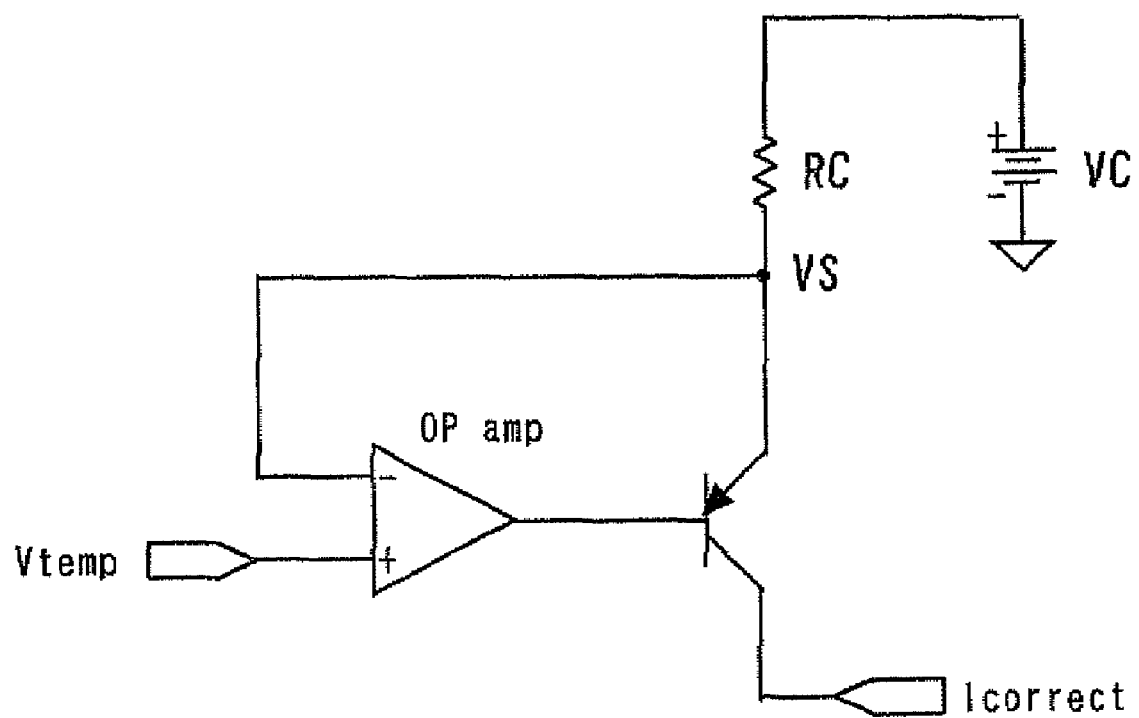
FIG. 8 is a circuit diagram illustrating a correction current generating circuit according to the third embodiment of the present invention.

FIG. 8 is a circuit diagram illustrating a correction current generating circuit according to the third embodiment of the present invention. $V_{temp}$ is a command value (voltage) outputted by the microprocessor 33. The correction current $I_{correot}$ takes the following value:

$$Icorrect = \frac{VC - Vtemp}{Rc}$$

Fourth Embodiment

Figure 9:
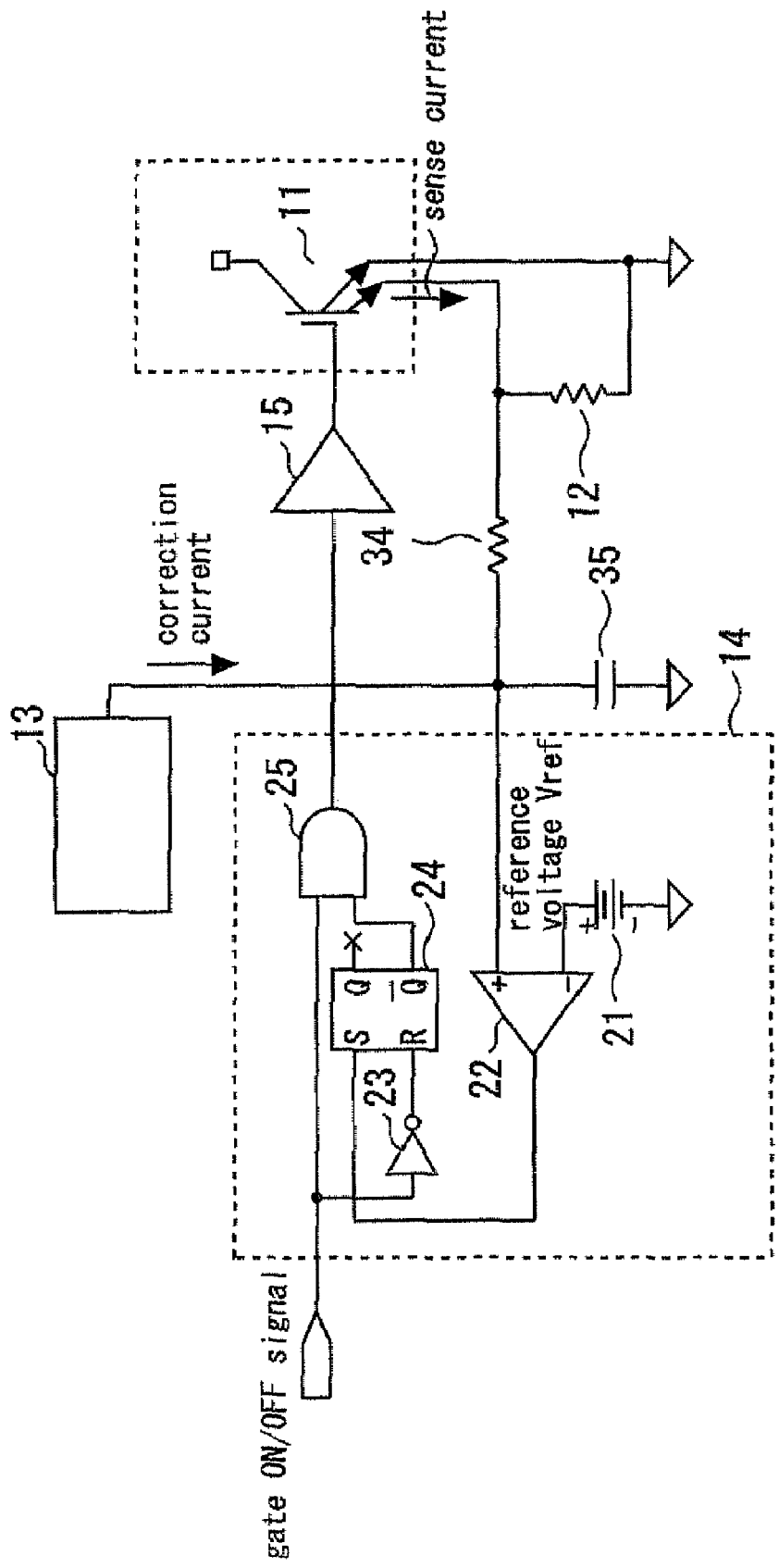
FIG. 9 is a circuit diagram illustrating a semiconductor device according to the fourth embodiment of the present invention.

FIG. 9 is a circuit diagram illustrating a semiconductor device according to the fourth embodiment of the present invention, A filter resistor 34 is provided between the connection point of the input of the overcurrent protective circuit 14 with the output of the correction current generating circuit 13 and an end of the sense resistor 12. A filter capacitor 35 is provided between the connection point of the input of the overcurrent protective circuit 14 with the output of the correction current generating circuit 13 and the grounding point. Other configurations are identical to the configurations of the first embodiment.

The filter resistor 34 and the filter capacitor 35 form a low-pass filter (hereafter abbreviated as "LPF"), which exerts the function of noise removal. Since the input impedance of the comparator 22 is sufficiently larger than the resistance of the added filter resistor 34 and sense resistor 12, the correction current flows through the added filter resistor 34 and sense resistor 12.

Here, when the main current of the switching element reaches a specified value, the overcurrent protective circuit operates. The operation of the overcurrent protective circuit is referred to as SC trip; and the value of the main current at which the overcurrent protective circuit operates is referred to as SC trip level. The resistance of the sense resistor 12 is set so that the voltage drop of the sense resistor 12 (=resistance of sense resistor×sense current) equals to the reference voltage $V_{ref}$ of the overcurrent protective circuit when the main current becomes the SC trip level. In general, the resistance of the sense resistor 12 is set to be several ohms to several-ten ohms depending on the sense current flowing through the current sensing element. On the other hand, the resistance of the filter resistor 34 can be optionally set within a wide range between several ohms and several-hundred ohms.

In the first embodiment, the voltage inputted in the correction current generating circuit is sense resistance×(sense current+correction current). While in the fourth embodiment, the voltage inputted in the correction current generating circuit is sense resistance×(sense current+correction current)+filter resistance×correction current. Therefore, the fourth embodiment not only exerts the same effect as in the first embodiment, but also reduces correction current more than the first embodiment. It is particularly preferable that the resistance of the filter resistor is higher than the resistance of the sense resistor. As a result, the effect of the voltage drop by the correction current and the sense resistor on the current sensing element can be reduced.

For example, when the resistance of the sense resistor 12 is 100Ω and the sense voltage inputted in the comparator 22 is raised by 0.1 V, in the configuration of the first embodiment, the correction current is 0.2 V/100Ω=1 mA. On the other hand, in configuration of the fourth embodiment, when the resistance of the filter resistor 34 is 9.9 kΩ, the correction current is 0.1 V/(9.9 kΩ+100Ω)=10 µA. The voltage drop of the sense resistor 12 due to the correction current is 100Ω×10 µA=I mV, and is a minute value compared with $V_{GE}$ and $V_{CE}$ of the current sensing element. Therefore, the effect on the sense current flowing through the current sensing element can be ignored. On the other hand, in the first embodiment, since $V_{GE}$ and $V_{CE}$ of the current sensing element are lowered by the voltage drop in the sense voltage of 0.1 V, the sense current is reduced.

Fifth Embodiment

Figure 10:
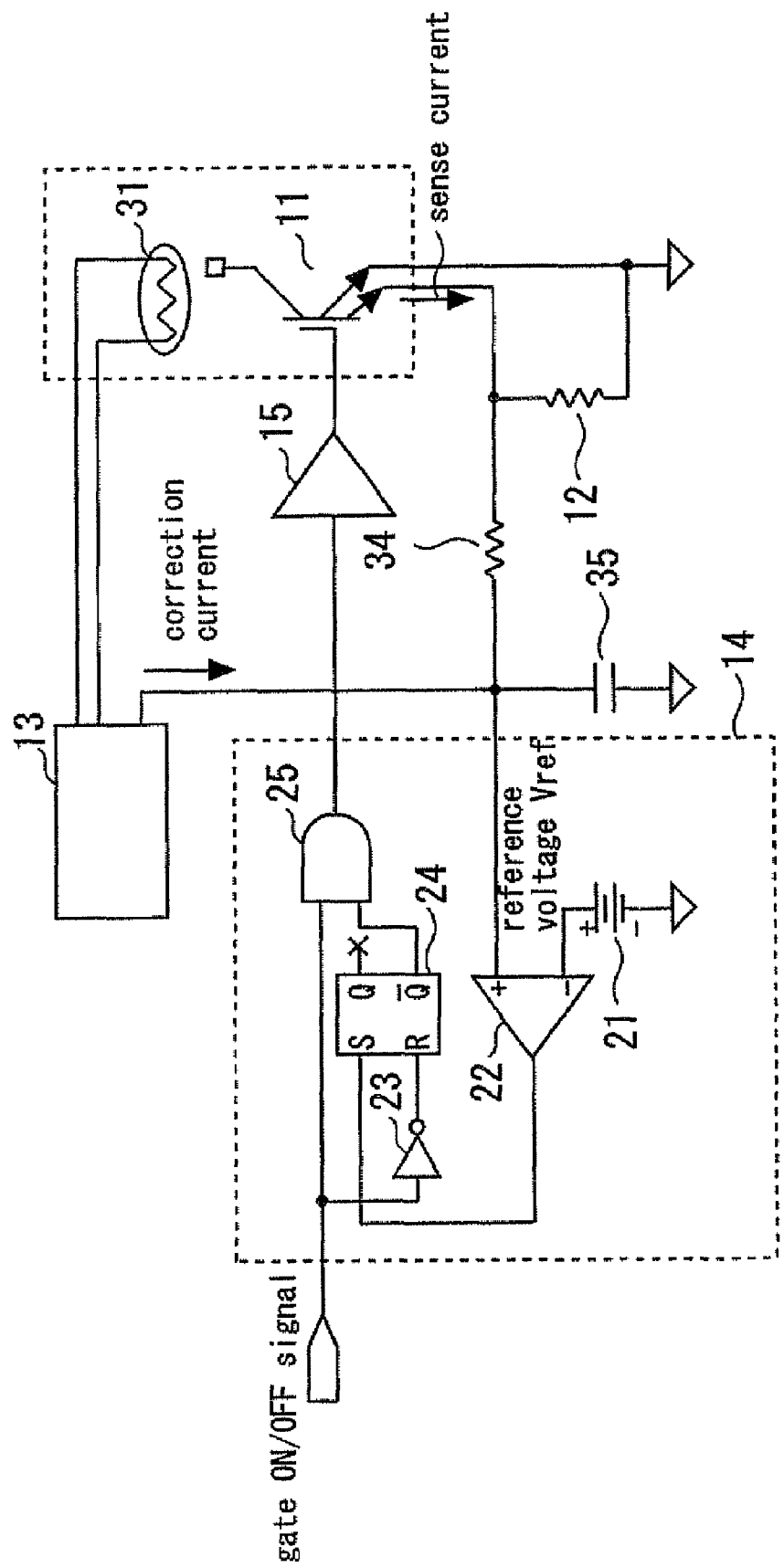
FIG. 10 is a circuit diagram illustrating a semiconductor device according to the fifth embodiment of the present invention.

FIG. 10 is a circuit diagram illustrating a semiconductor device according to the fifth embodiment of the present invention. A filter resistor 34 is provided between the connection point of the input of the overcurrent protective circuit 14 with the output of the correction current generating circuit 13 and an end of the sense resistor 12. A filter capacitor 35 is provided between the connection point of the input of the overcurrent protective circuit 14 with the output of the correction current generating circuit 13 and the grounding point. Other configurations are identical to the configurations of the second embodiment. Thereby, not only the same effect as the second embodiment is exerted, but also the correction current can be more reduced than the second embodiment.

Sixth Embodiment

Figure 11:
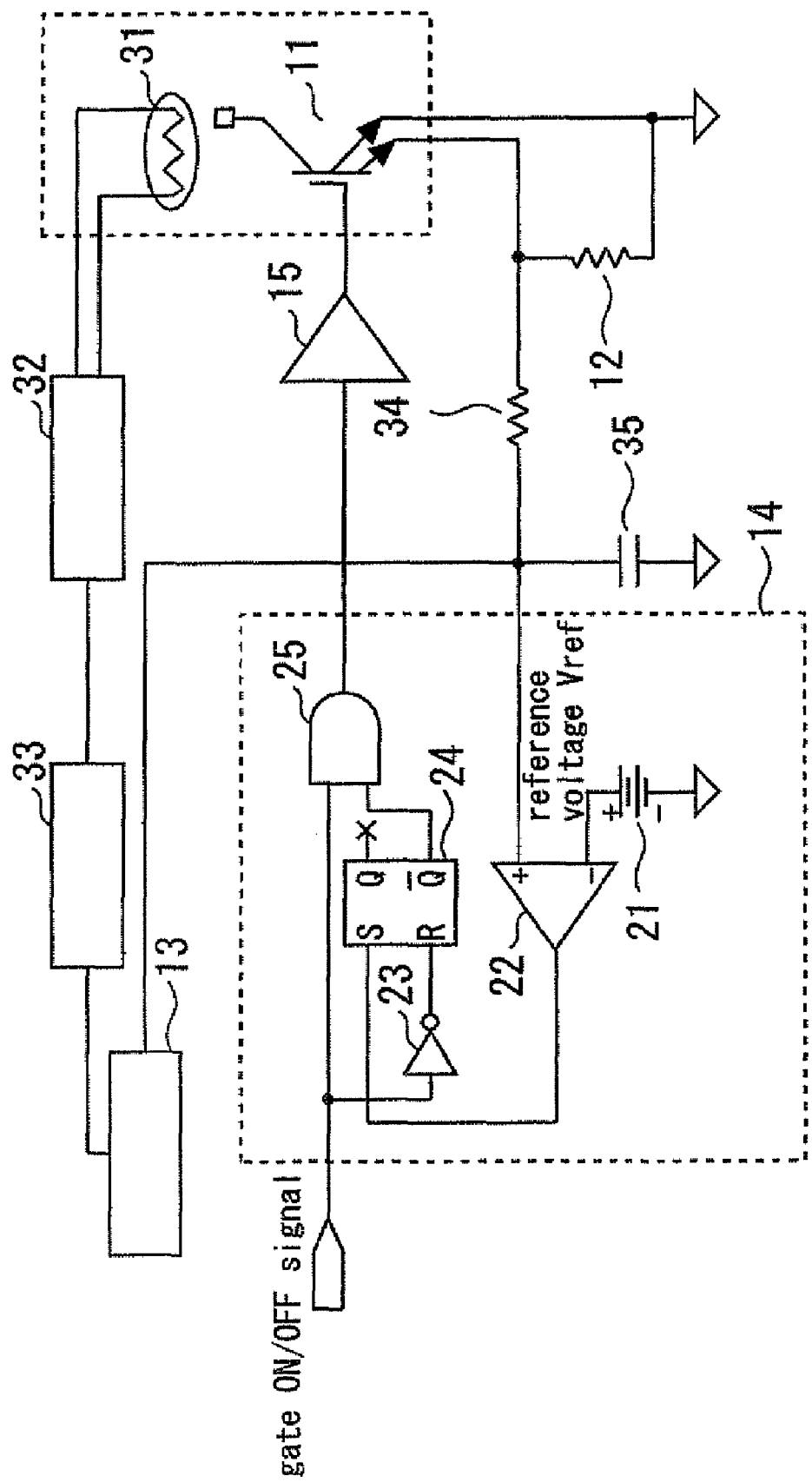
FIG. 11 is a circuit diagram illustrating a semiconductor device according to the sixth embodiment of the present invention.
Figure 12:
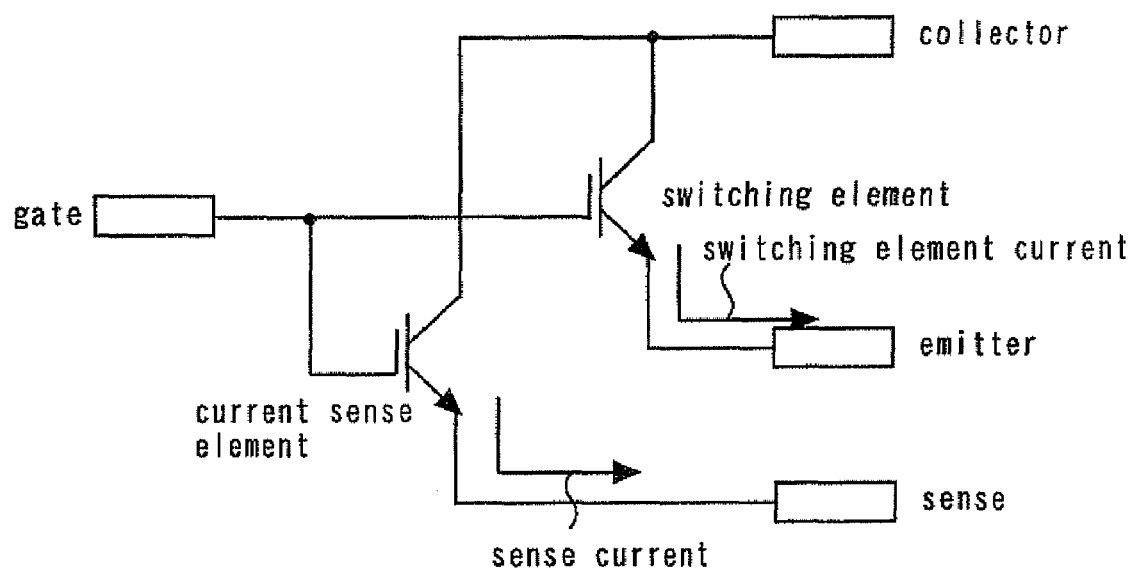
FIG. 12 is a diagram illustrating an equivalent circuit of a switching element that incorporates a current sensing element.
Figure 13:
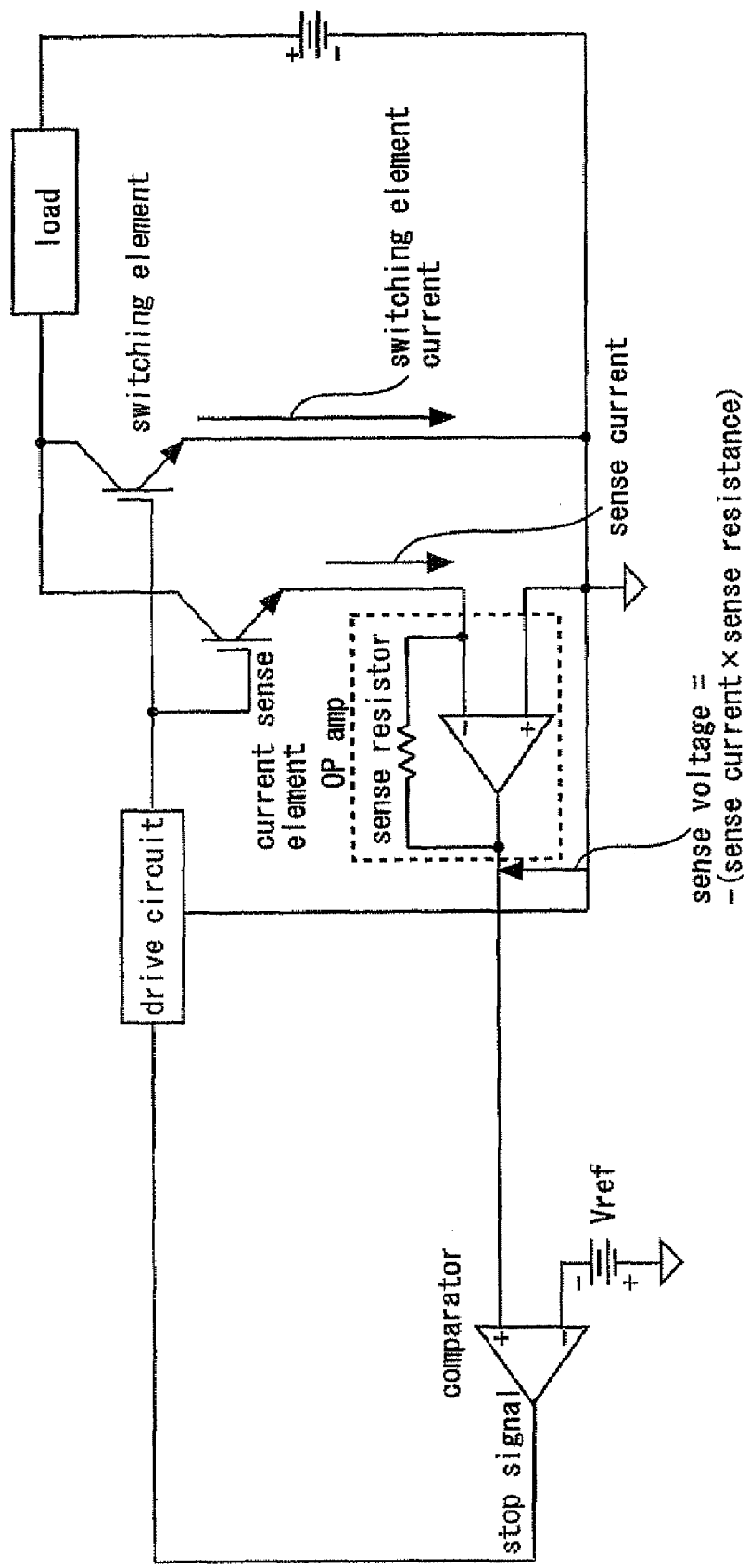
FIG. 13 is a circuit diagram illustrating a conventional semiconductor device.
Figure 14:
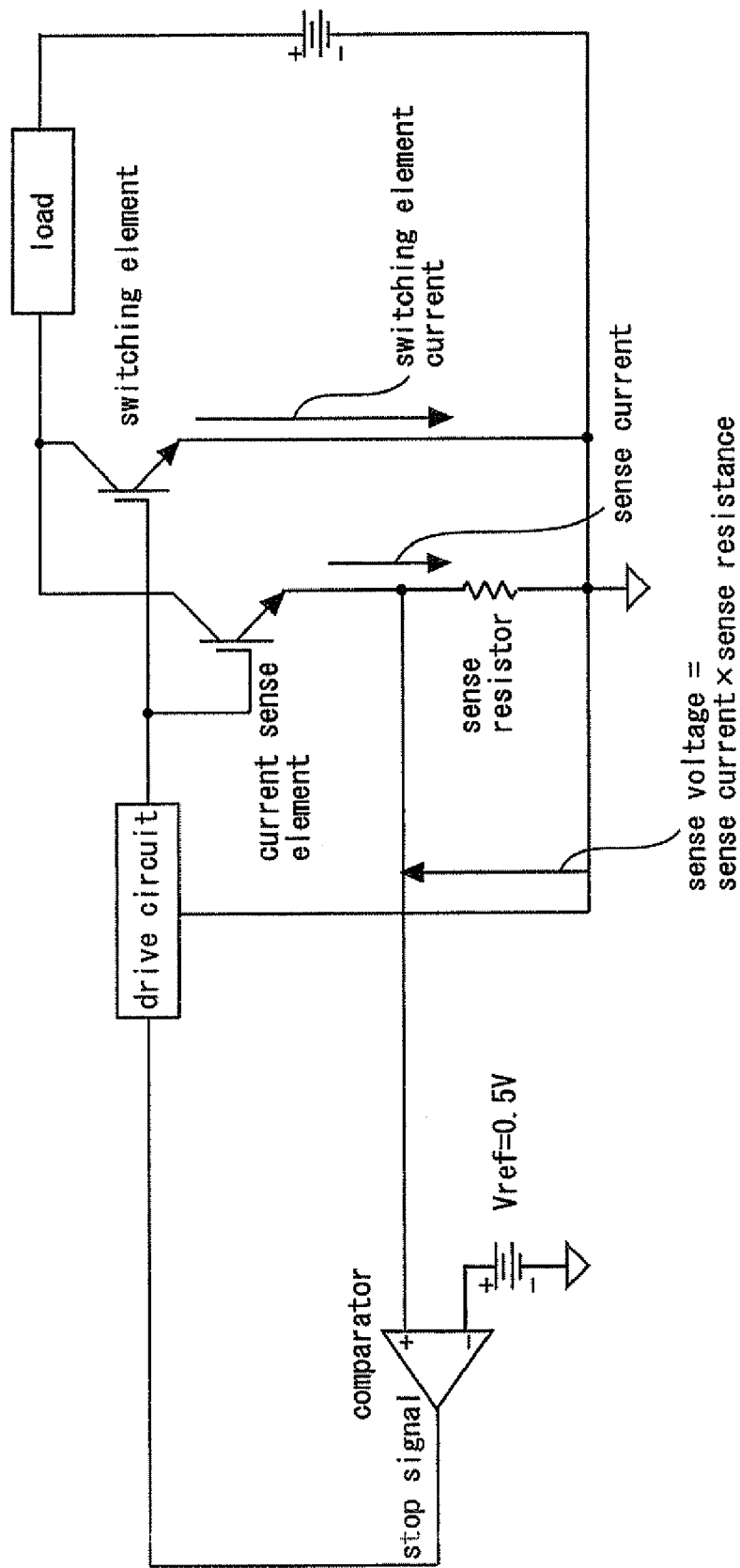
FIG. 14 is a circuit diagram illustrating a conventional semiconductor device.

FIG. 11 is a circuit diagram illustrating a semiconductor device according to the sixth embodiment of the present invention. A filter resistor 34 is provided between the connection point of the input of the overcurrent protective circuit 14 with the output of the correction current generating circuit 13 and an end of the sense resistor 12. A filter capacitor 35 is provided between the connection point of the input of the overcurrent protective circuit 14 with the output of the correction current generating circuit 13 and the grounding point. Other configurations are identical to the configurations of the third embodiment. Thereby, not only the same effect as the third embodiment is exerted, but also the correction current can be more reduced than the third embodiment.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-041212, filed on Feb. 21, 2007 including specification, claims, drawings and summary, on which the Convention priority of the present application is based, are incorporated herein by reference in its entirety.

What is claimed is:

1. A semiconductor device comprising:
    a switching element having a sense terminal and that outputs at the sense terminal a sense current, in shunt and at a fixed ratio of a main current flowing in said switching element;
    a sense resistor having a first end connected to said sense terminal and a second end that is grounded;
    a correction current generating circuit that supplies and extracts a correction current at the first end of said sense resistor;
    an overcurrent protective circuit that receives a sense voltage generated when the sense current and the correction current flow through said sense resistor, and outputs a stop signal when the sense voltage is larger than a reference voltage;

a driving circuit that stops driving said switching element when the stop signal is received from said overcurrent protective circuit; and a temperature sensor measuring temperature of said switching element, wherein said correction current generating circuit increases or decreases the correction current so that the correction current is proportional to the temperature of said switching element that is sensed by said temperature sensor.

2. A semiconductor device comprising:

a switching element having a sense terminal and that outputs at the sense terminal a sense current, in shunt and at a fixed ratio of a main current flowing in said switching element;

a sense resistor having a first end connected to said sense terminal and a second end that is grounded;

a correction current generating circuit that supplies and extracts a correction current at the first end of said sense resistor;

an overcurrent protective circuit that receives a sense voltage generated when the sense current and the correction current flow through said sense resistor, and outputs a stop signal when the sense voltage is larger than a reference voltage;

a driving circuit that stops driving said switching element when the stop signal is received from said overcurrent protective circuit;

a temperature sensor measuring temperature of said switching element; and a microprocessor controlling said correction current generating circuit according to a predetermined program that increases or decreases the correction current according to the temperature of said switching element that is sensed by said temperature sensor.

3. The semiconductor device according to claim 1 further comprising a filter resistor connected between a junction of the input of said overcurrent protective circuit and the output of said correction current generating circuit, and the first end of said sense resistor.

4. The semiconductor device according to claim 2 further comprising a filter resistor connected between a junction of the input of said overcurrent protective circuit and the output of said correction current generating circuit, and the first end of said sense resistor.

* * * * *